United States Patent
Meaney

(10) Patent No.: US 8,838,550 B1
(45) Date of Patent: Sep. 16, 2014

(54) READABLE TEXT-BASED COMPRESSION OF RESOURCE IDENTIFIERS

(75) Inventor: Michael Meaney, Dublin (IE)

(73) Assignee: Amazon Technologies, Inc., Reno, NV (US)

( * ) Notice: Subject to any disclaimer, the term of this patent is extended or adjusted under 35 U.S.C. 154(b) by 348 days.

(21) Appl. No.: 13/169,510

(22) Filed: Jun. 27, 2011

(51) Int. Cl.
*G06F 7/00* (2006.01)
*G06F 17/00* (2006.01)

(52) U.S. Cl.
USPC .......................................................... 707/693

(58) Field of Classification Search
USPC ........................................ 707/693, 999.002
See application file for complete search history.

(56) References Cited

U.S. PATENT DOCUMENTS

| | | | |
|---|---|---|---|
| 2004/0248558 A1* | 12/2004 | Chandhok | 455/412.1 |
| 2007/0168560 A1* | 7/2007 | Alkire | 709/247 |
| 2008/0307044 A1* | 12/2008 | Musson | 709/203 |
| 2011/0295990 A1* | 12/2011 | St. Jean et al. | 709/223 |

* cited by examiner

*Primary Examiner* — Aleksandr Kerzhner
(74) *Attorney, Agent, or Firm* — Thomas Horstemeyer, LLP

(57) ABSTRACT

Provided are techniques for compressing a text string that includes multiple parameter keys and multiple corresponding parameter values. In an example embodiment, the techniques include identifying the parameter keys and determining corresponding parameter key identifiers. In this embodiment, a first portion of a compressed URL is generated as a string of unique parameter key identifiers that corresponds to the plurality of parameter key identifiers. A second portion of the compressed URL is generated as a parameter value list that corresponds to the string of the plurality of unique parameter key identifiers and to corresponding ones of the plurality of parameter values. In addition to the foregoing, other techniques are described in the figures, description, and claims.

31 Claims, 8 Drawing Sheets

| Parameter Key — 180 | Identifier — 182 |
|---|---|
| NameSpace | NS |
| MetricName | MN |
| EndTime | ET |
| Statistic | SS |
| Axis | AX |
| DimensionValue | DV |
| DimensionName | DN |
| VolumeID | VI |
| VolumeIdleTime | VT |
| StartTime | ST |

FIG. 5

READABLE TEXT-BASED COMPRESSION OF RESOURCE IDENTIFIERS

BACKGROUND

Cloud computing refers to the provision of computational resources on demand via a computer network, such as applications, databases, file services, email, etc. In the traditional model of computing, both data and software are typically fully contained on the user's computer. In cloud computing, data may be hosted and/or applications may be executed on remote computer systems. As such, in one example use case, a user's computer may contain minimal software or data (perhaps an operating system and/or web browser), and may serve as little more than a display terminal for processes occurring on a network of external computers.

A variety of services running on remote computer systems may be requested and/or accessed using, for example, a web browser. For example, an application running on a remote computer may gather and/or determine data that includes and/or is defined by multiple different metrics. Using a web browser, a request for such data may be expressed as a uniform resource locator (URL) and/or a uniform resource identifier (URI). However, a URL/URI corresponding to such requests may be very long and, in some instances, may exceed maximum character limits of a web browser and/or other computing resources.

BRIEF DESCRIPTION OF THE DRAWINGS

FIG. 5 illustrates an example of a look-up table for determining associations between parameter keys in an uncompressed text string and parameter key identifiers in a compressed text string according to some embodiments described herein.

DETAILED DESCRIPTION

Figure 1:
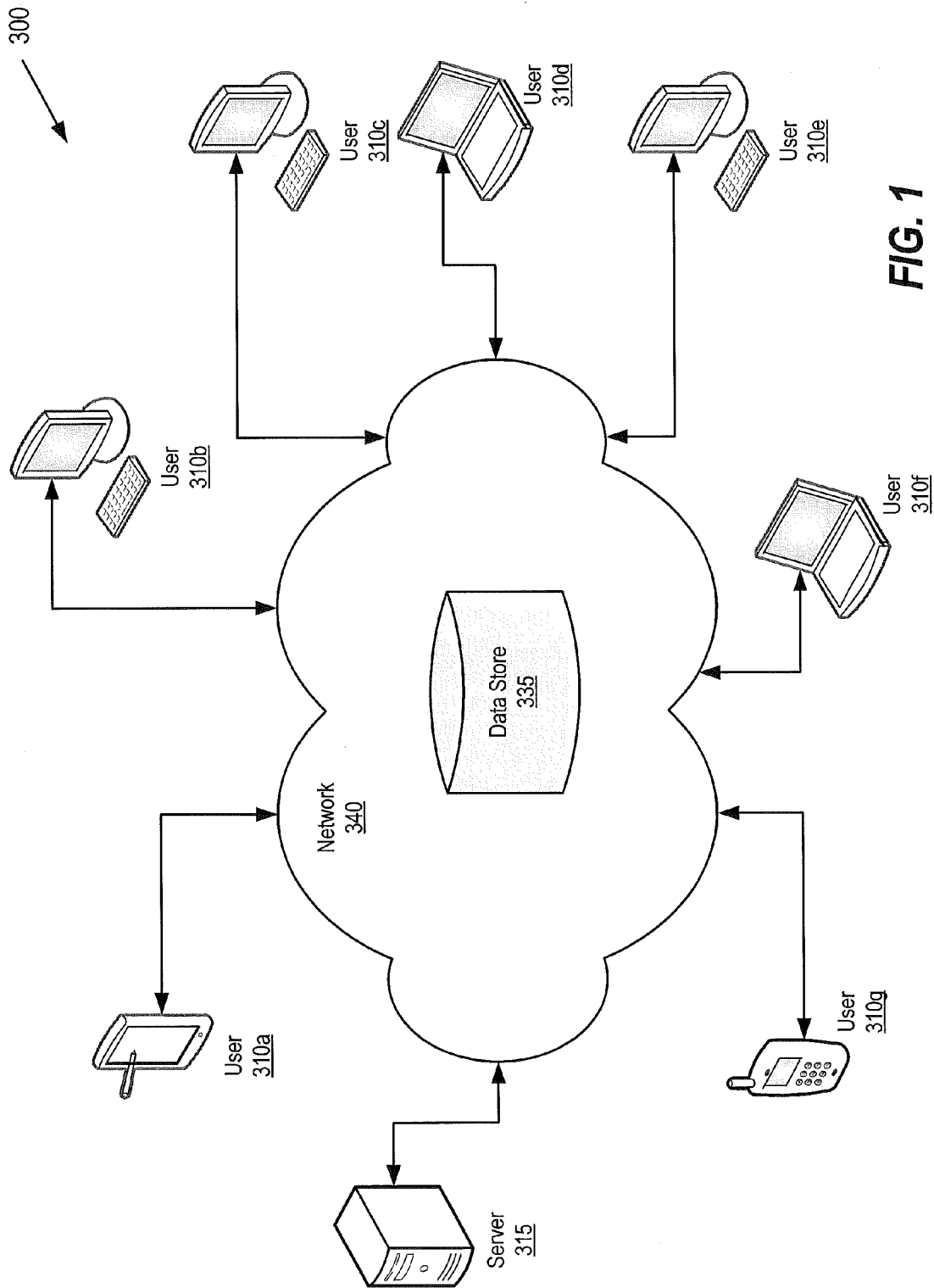
FIG. 1 is a block diagram of systems, devices, and computer program products for compressing a text string using corresponding services running on remote computer systems according to various embodiments described herein.

Various embodiments as disclosed herein provide for text-based compression of text strings. Such embodiments provide lossless and readable compression such that full functionality of order independent text strings may be realized. For example, in the context of a remote computing application, a web browser may gather and/or determine data responsive to a text string in the form of a uniform resource locator (URL). In an uncompressed form, such URLs may be substantially long and may exceed maximum character limits of various computing resources. Lossless compression that may be readable and thus editable may provide a URL that is fully functional and within resource specified limits. Although discussed by way of example in the context of compressing a URL, the systems, methods and computer program products described herein may be applicable to many different types of text strings.

The disclosure herein exploits a key/value configuration commonly used in text strings, such as, URLs. For example, a text string may include multiple different combinations of a parameter key and a corresponding parameter value that may be submitted as an argument to that parameter key. In the context of a known set of parameter keys, each parameter key may be expressed as a shortened text expression. For example, according to some embodiments, each parameter key may be represented in a compressed string as a two-letter identifier. Accordingly, a parameter key corresponding to a metric such as "NameSpace" may be represented by a parameter key identifier "NS", which provides an initial level of compression.

Additionally, the parameter key identifiers of a text string may be grouped into a single sequence and a corresponding parameter value array may be generated. Each element in the parameter value array may include a unique one of the parameter values in the text string. For example, repeated parameter values in the text string may all be represented by a single element in the parameter value array. In this manner, further compression may be achieved. Each element in the parameter key identifier sequence may be indexed to include an identification of the element in the parameter value array that corresponds to the parameter key identifier.

Yet further, the single sequence of parameter key identifiers may be arranged to group the same types of identifiers together. Once grouped together, repeated ones of the parameter key identifiers may be eliminated and/or discarded. In some embodiments, where the repeated parameter key identifiers correspond to the same parameter value, the first occurrence of the parameter key identifier may be indexed using a numerical range that identifies the element in the parameter value array to be used for each of the repeated parameter key identifiers and a quantity of repeated parameter key identifiers. Some embodiments provide that the quantity may be derived using the difference between a first value and a last value. When the repeated parameter key values do not correspond to the same parameter values, the first occurrence of the parameter key identifier may be indexed to identify the element in the parameter value array that corresponds to that identifier. Subsequent entries in the parameter key identifier sequence may include just an index value that identifies respective ones of the elements in the parameter value array. In this regard, yet further compression of the text string is realized. Additionally, compression rates may become particularly high in text strings that include many repeated parameter keys and/or parameter values.

FIG. 1 is a block diagram of systems, devices, and computer program products for compressing a text string using corresponding services running on remote computer systems according to various embodiments described herein. Referring now to FIG. 1, a communications environment or system 300 may include a plurality of user devices 310a-310g and a server 315 configured to provide for data services and/or other communication with the user devices 310a-310g via a network 340. The plurality of user devices 310a-310g may be wired or wireless communication terminals, such as desktop computers, laptop computers, cellular telephones, smartphones, electronic book readers, tablets and the like, and may be configured to access the network 340 via wired and/or wireless connections. In some embodiments, the user devices 310a-310g may include relatively little internally-stored software or data, and may rely on interaction with the network and/or server 315 for at least some processing and/or data management. Although not specifically illustrated, the user devices 310a-310g and the server 315 may connect to the network 340 via one or more infrastructure elements (e.g., base stations, switches, etc.), the details of which are known in the art and need not be described further herein.

In some embodiments, the network 340 includes a data store 335 configured to store a plurality of data objects therein. As used herein, the term "data store" can refer to the storage of data on one or more servers 315 in a computing environment external to the devices 310a-310g and 315. For example, the data store 335 could be a database, a file server, a storage area network, etc. In addition, the data store 335 may physically span across multiple servers in some embodiments. The data objects stored in the data store 335 may include any data associated with or otherwise provided by one or more of the user devices 310a-310g and/or the server 315 for external storage in the network 340. In some embodiments, the data store 335 may include data that provides associations between parameter keys in an uncompressed text string and parameter key identifiers in a compressed text string. In this manner, ones of the server 315 and/or user devices 310a-310g may access the data store 335 for compression and/or decompression operations described herein. Some embodiments provide that data corresponding to the associations between parameter keys and parameter key identifiers may be stored locally at any of the servers 315 and/or the user devices 310a-310g.

According to embodiments herein, one or more of the user devices 310a-310g may request a service to gather and/or determine data from the server 315. In particular, a request for such service and/or data may be in the form of a text string that may be substantially long. Some embodiments provide that the text string may be compressed as discussed herein prior to transmission from a requesting user, however, the disclosure is not so limiting. The server 315 may then decompress the compressed text string and perform the requested service and/or data responsive to the request.

Although FIG. 1 illustrates an example communications environment 300 in accordance with some embodiments, it will be understood that the present disclosure is not limited to such a configuration but is intended to encompass any configuration capable of carrying out the operations described herein. While described with reference to particular operations performed by the server 315, the network 340 and/or the user devices 310a-310g, it will be understood that a plurality of distributed network elements may collectively perform some or all of the operations described herein. More generally, various functionality described herein in separate functional elements may be combined within a single functional element, and, vice versa, functionality described herein in a single functional element can be carried out by a plurality of separate functional elements.

Figure 2:
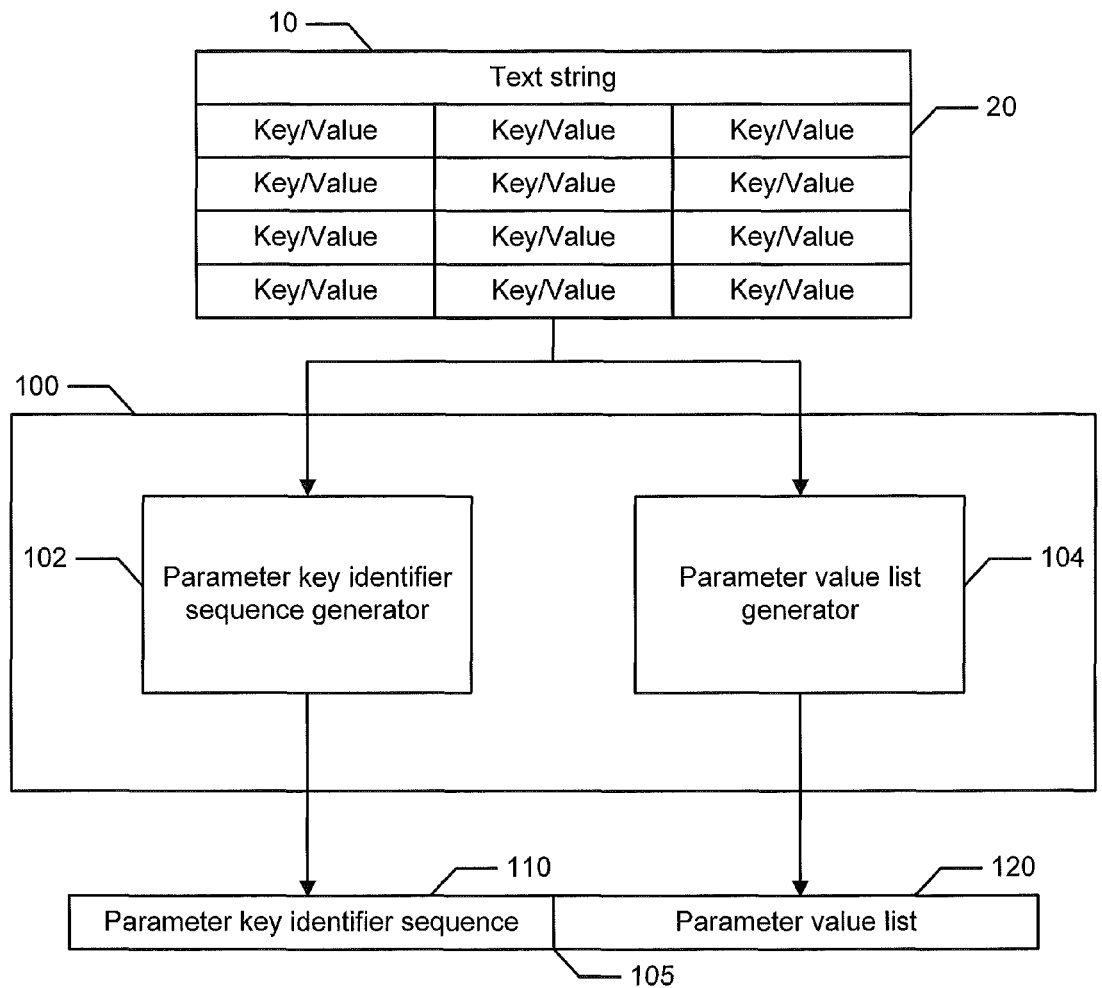
FIG. 2 is a block diagram of systems, devices, and computer program products for providing readable compression of a text string according to various embodiments described herein.

Reference is now made to FIG. 2, which is a block diagram of systems, devices, methods and computer program products for providing readable compression of a text string according to various embodiments described herein. A system 100 is configured to provide readable compression of a text string 10 that includes multiple parameter key/value sets 20. The system 100 may include a processor (not shown) and a memory (not shown) that is coupled to the processor. The memory may include instructions that, upon execution by the processor, instantiate the operations described herein. The system 100 includes a parameter key identifier sequence generator 102 that is operable to generate a sequence of parameter key identifiers 110 from parameter key/value sets 20. In some embodiments, the sequence of parameter key identifiers 110 includes sequence numbers that identify unique positions for each of the parameter key identifiers in the sequence.

In some embodiments, the parameter key identifiers may be identified using a look-up table that includes associations between the parameter keys and the parameter key identifiers. In addition to determining the parameter key identifiers during compression, the look-up table may also be used to determine the parameter keys from the parameter key identifiers during a decompression operation. Brief reference is made to FIG. 5, which illustrates an example of a look-up table for determining associations between parameter keys in an uncompressed text string and parameter key identifiers in a compressed text string according to some embodiments described herein. Note that a parameter key column 180 and an identifier column 182 include respective listings of corresponding entries. For example, an "EndTime" parameter key may be represented by an "ET" identifier. The listings illustrated in FIG. 5 are by way of example only and do not represent a complete or exhaustive list of possible parameter keys and/or corresponding identifiers.

Some embodiments provide that the look-up table may be stored and/or transmitted with the uncompressed, compressed and/or decompressed text string. Some embodiments provide that the look-up table may be stored in one or more remote data storage repositories. For example, a central storage network location may be used and may be accessed during compression and/or decompression operations. Additionally, multiple different users and/or agents thereof may store one or more copies of the look-up table to provide local access thereto. In this manner, the look-up table may be centrally and/or remotely stored and/or maintained. Although example embodiments herein may describe the parameter key identifiers as including two-letter alphabetic expressions, the disclosure is not so limited. For example, the parameter key identifiers may include more and/or less than two letters, numbers, and/or symbols.

In some embodiments, a set of possible parameter keys may be known and thus finite. For example, some text strings may include as little as sixteen distinct parameter keys. As such, a compressed text string may include one of more fields that include a mapping that indicates the key identifiers corresponding to each of the parameter keys used in the text string. For example, an array of the set of parameter keys may be provided such that the parameter key identifier corresponds to a position in the array. In this manner, the parameter key identifiers may be numeric representations of corresponding parameter keys.

Figure 3:
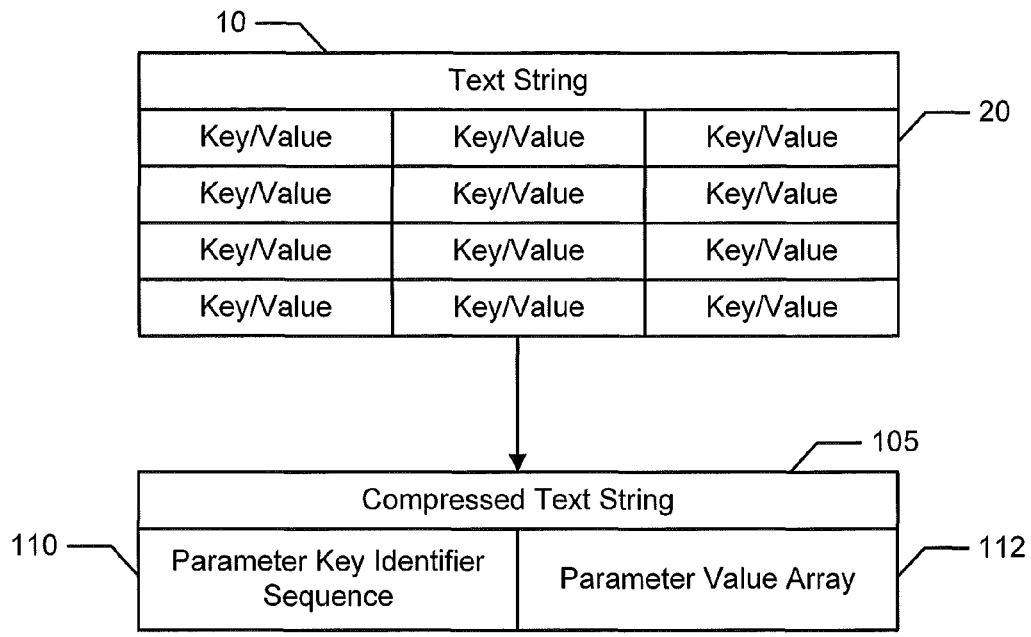
FIG. 3 is a block diagram illustrating example formats of a text string and a compressed text string according to some embodiments described herein.

Turning back to FIG. 2, the system 100 may include a parameter value list generator 104 that is operable to generate a parameter value list 120 that correspond to ones of the parameter key identifiers 110. The compressed text string 105 may include the sequence of the parameter key identifiers 110 and the parameter value list 120. Some embodiments provide that the parameter value list may include a parameter value array. For example, brief reference is made to FIG. 3, which is a block diagram illustrating example formats of a text string 10 and a corresponding compressed text string 105 according to some embodiments described herein. The text string 10 includes multiple combinations of parameter keys and corresponding parameter values 20. A compressed text string 105 may include a parameter key identifier sequence 110 and a parameter value array 112. Some embodiments provide that the parameter value array 112 may be included in the compressed text string 105 and may be identified as the parameter value array 112 using a specific text code such as "VA," for example. An example of a value array according to some embodiments herein follows:

VA~VolumeIdleTime~Average~300~Left~VolumeId~vol-0e123k67.

The "VA" indicates that the subsequent characters are the parameter value array elements. In the above example, the parameter value array elements are delimited by the "~" symbol. However, any symbol and/or combination of symbols that would not otherwise be confused as a value array element may be used according to the disclosure herein. In some embodiments, the parameter value array elements may be grouped together so that a range of related parameter values may be defined and/or identified using index values in the parameter key identifier sequence.

The system 100 and operations thereof may be applicable to provide compression to a variety of different types of text strings 10. For example, a text string 10 may include a URL, uniform resource identifier (URI) and/or an extensible markup language (XML) expression among others. Although operations described herein generally benefit from an order independent text string, some XML expressions are not order independent. However, in some applications, an application programming interface (API) may be configured to receive a request and/or input in either a URL format or an XML format. In this regard, the text string 10 may be an XML expression that may be compressed using and subsequently decompressed according to operations described herein.

Some embodiments provide that the parameter key identifier sequence generator 102 is further operable to group ones of the parameter key identifiers as a function of a similarity. For example, the parameter key identifier sequence generator 102 may identify ones of the parameter keys in the text string 10 that are the same as one another. Although described as grouping the parameter keys, some embodiments provide that the grouping operations may be performed on the parameter key identifiers after they have been determined. Regardless of the order of operations, groups of parameter keys and/or parameter key values that are the same as one another may be provided. By grouping parameter keys that are the same, further compression may be realized by listing the corresponding parameter key identifier one time to represent all occurrences of that identifier.

The parameter values corresponding to the grouped parameter key identifiers may be the same and/or different from one another. If the parameter values are the same, then the parameter value list generator 104 is further operable to generate the parameter value list 120 that includes an element that is the repeated parameter value. In this manner, the same parameter value that corresponds to multiple ones of the parameter key identifiers may be listed a single time instead of for every instance of those parameter key identifiers. Additionally, the parameter key identifier sequence generator 102 may generate the parameter key identifier sequence 110 to include index values that may be in the sequence with and/or instead of the parameter key identifiers.

The parameter key identifier sequence generator 102 is further operable to identify parameter keys that are the same and that are associated with different parameter values. The parameter key identifier sequence 110 may include a first element that is the same parameter key identifier and a first sequence number corresponding to the first one of the parameter values and a second element that includes a second sequence number that identifies a corresponding second parameter value. Some embodiments provide that the parameter value list generator 104 is further operable to generate the list of the parameter values that includes a first parameter value that corresponds to the first element in the sequence of the parameter key identifier sequence.

Figure 9A:
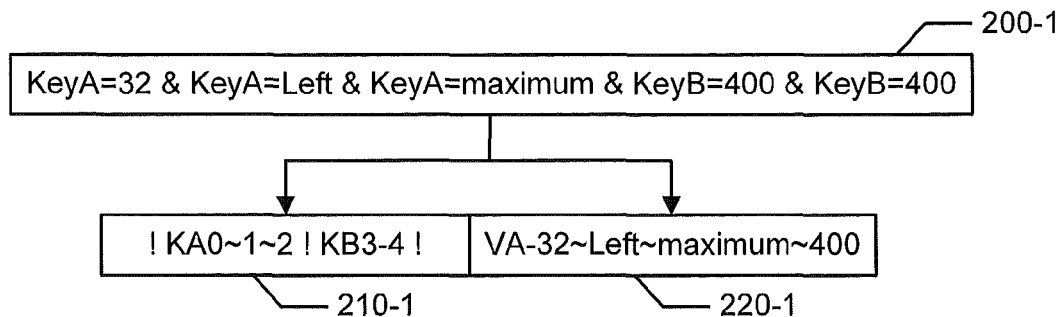
FIGS. 9A-9B are block diagrams illustrating example text strings and corresponding parameter key identifier sequences and parameter value arrays according to some embodiments disclosed herein.

Brief reference is made to FIG. 9A, which is a block diagram illustrating an example text string 200-1 and a corresponding parameter key identifier sequence 210-1 and parameter value array 220-1 according to some embodiments disclosed herein. Note that the text string 200-1 includes multiple parameter key/parameter value combinations that are separated by an "&". The parameter value array 220-1 includes as elements, each unique parameter value that is in the text string 200-1 separated by a delimiting symbol "~". The parameter key identifier sequence 210-1 includes two character identifiers and/or index values that correspond to each of the parameter keys (i.e., KA corresponds to KeyA, etc.) The elements in the parameter key identifier sequence 210-1 are each separated by a delimiting symbol "!" that is different from that of the parameter value array 220-1.

Note that although the parameter key KeyA is repeated two times (3 total occurrences) in the text string 200-1 and corresponds to three different parameter values (32, left, and maximum), the parameter key identifier sequence 210-1 includes an identifier corresponding to KeyA (KA) only one time. The index value "0" that is adjacent to the KA identifier indicates that the first occurrence of KeyA corresponds to a value in the "0" position of the parameter value array 220-1, namely "32." Subsequent index values "1" and "2" indicate that the subsequent occurrences of KeyA correspond to the "1" and "2" positions of the parameter value array 220-1.

Additionally, parameter key KeyB is repeated once and corresponds to the same parameter value. In this regard, the parameter key identifier sequence 210-1 includes an identifier corresponding to KeyB (KB) only once. The parameter key identifier sequence 210-1 includes KB3-4, indicating that the two occurrences of KeyB correspond to the value in the "3" or fourth position of the parameter value array, namely "400." In this manner, the repeated parameter key identifier KB and the parameter value "400" only occur once in the parameter key identifier sequence 210-1 and parameter value array 220-1, respectively.

In some embodiments, different occurrences of the same parameter key (e.g., KeyA) may be individually indexed within the text string. For example, the three occurrences of KeyA in the text string 200-1 might be expressed as KeyA1, KeyA2 and KeyA3. In this regard, the corresponding parameter key identifiers in the parameter key identifier sequence 210-1 may be KA1~0, KA2~1 and KA3~2. In some embodiments, where a sequence of parameter keys may be assumed to include no gaps in the sequence, then the corresponding key identifiers in the parameter key identifier sequence 210-1 may be further compressed to KA0~1~2 by not referencing the index numbers. Similarly, different occurrences of KeyB may be denoted in the text string as KeyB1 and KeyB2 and the corresponding parameter key identifier may be expressed as KB1~2~4, denoting that the two different occurrences of KeyB (1 and 2) both are associated with the parameter value in position 4 of the parameter value array.

Figure 9B:
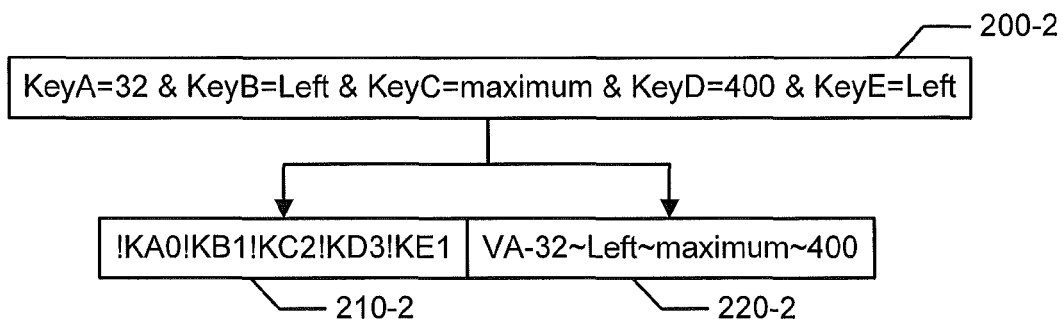

Brief reference is made to FIG. 9B, which is a block diagram illustrating an example text string 200-2 and a corresponding parameter key identifier sequence 210-2 and parameter value array 220-2 according to some embodiments disclosed herein. Note the text string 200-2 includes multiple parameter key/parameter value combinations that are separated by an "&". The parameter value array 220-2 includes as elements, each unique parameter value that is in the text string 200-2 separated by a delimiting symbol "~". Note that although the parameter value "Left" corresponds to two different parameter keys (KeyB and KeyD), the parameter value array 220-2 only provides a single element for that parameter value. The parameter key identifier sequence 210-2 includes two character identifiers that correspond to each of the parameter keys (i.e., KA corresponds to KeyA, etc.) The elements in the parameter key identifier sequence 210-2 are each separated by a delimiting symbol "!" that is different from that of the parameter value array 220-2.

The elements in the parameter key identifier sequence 210-2 include index values that correspond to elements in the parameter value array 220-2. For example, the KA includes a "0" index that corresponds to the value in the "0" or first position in the parameter value array 220-2, namely "32." The KE parameter key identifier includes a "1" index value, which corresponds to the value in the "1" or second position of the parameter value array, namely "Left." In this manner, the repeated parameter value "Left" only occurs once in the parameter value array. As shown, compression rates may be positively correlated with the quantity of repeated parameter values in a text string.

Figure 4:
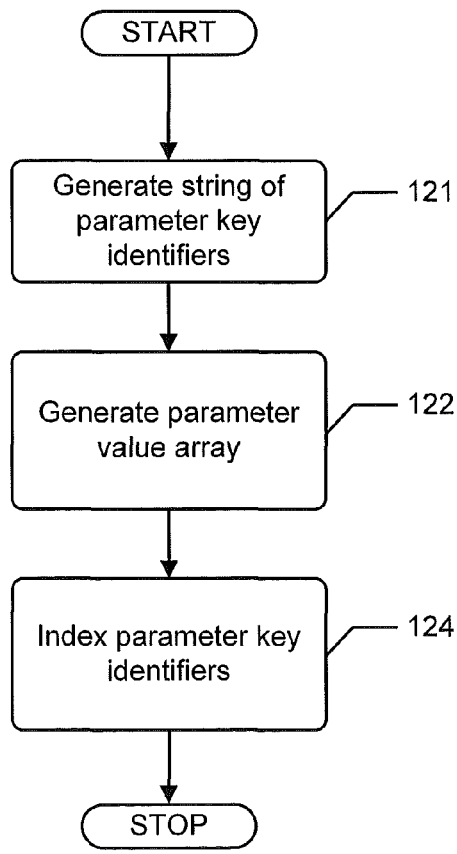
FIG. 4 is a flowchart of operations for generating a compressed URL according to some embodiments described herein.

Reference is made to FIG. 4, which is a flowchart of operations for generating a compressed URL according to some embodiments described herein. Some embodiments provide that operations include generating a string of parameter key identifiers that correspond to parameter keys in a URL (block 121). In some embodiments, parameter key identifiers may be generated using a look-up table that includes associations between ones of parameter keys and parameter key identifiers. Some embodiments provide that ones of the parameter key identifiers that are the same may be grouped together. By grouping like ones of the parameter key identifiers, a parameter key identifier sequence may be generated that includes a single entry of a parameter key identifier that may represent multiple occurrences of the corresponding parameter key in the URL.

A parameter value array that includes unique parameter values from the URL as elements therein may be generated (block 122). As the parameter value array includes unique parameter values from the URL, multiple occurrences of the same parameter value in the URL may be represented by a single parameter value in the parameter value array. Additionally, the string of the parameter key identifiers may be indexed to correspond to elements in the parameter value array (block 124). In addition to identifying which elements in the parameter value array correspond to specific parameter key identifiers in the parameter key identifier sequence, the index values may provide additional information regarding repeated parameter values and/or parameter key identifiers, among others. For example, index values may be used in the parameter key identifier sequence as individual elements that identify a different parameter value corresponding to a previously occurring parameter key identifier that precedes the index value in the parameter key identifier sequence.

Figure 6:
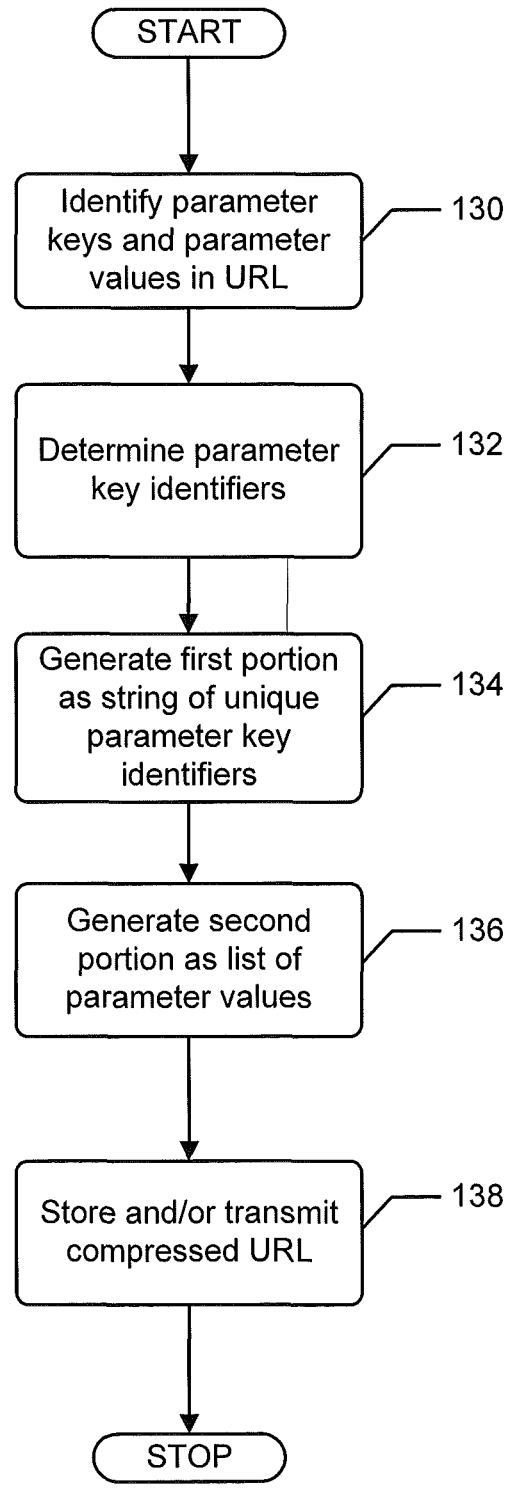
FIG. 6 is a flowchart of operations for compressing a URL according to further embodiments described herein.

Reference is now made to FIG. 6, which is a flowchart of operations for compressing a URL according to further embodiments described herein. As described herein, a URL may include multiple parameter keys that are provided with multiple parameter values. For example, each parameter value may correspond to a parameter key. Operations may include identifying parameter keys and parameter values in the URL (block 130). Some embodiments provide that a URL may include parameter key/parameter value combinations that are separated by delimiting symbols such as an ampersand ("&"). Additionally, in some embodiments, the parameter key may precede and be separated from the parameter value by an assignment operator such as the equal sign ("="). In this regard, for each combination, the portion before the "=" may be identified as parameter keys and the portion after the "=" may be determined as parameter values.

Parameter key identifiers, respective ones of which correspond to and include fewer characters than ones of the parameter keys may be determined (block 132). The parameter key identifiers may be determined using a look-up table and/or other persistent data structure, among others. Some embodiments provide that a look-up table may be stored and/or transmitted with the URL, a compressed URL and/or a decompressed URL. A look-up table and/or a copy thereof may be stored in a central and/or remote data repository for access during any compression and/or decompression operations.

A first portion of a compressed URL may be generated as a string of unique identifiers that corresponds to the parameter key identifiers (block 134). Some embodiments provide that generating the string of unique identifiers includes arranging a sequence of parameter key identifiers that are the same as one another. Some other embodiments provide that the parameter keys may be grouped before the parameter key identifiers are determined. Generating the string of unique identifiers may include numerically indexing the unique parameter key identifiers.

A second portion of the compressed URL may be generated as a parameter value list that corresponds to the string of unique parameter key identifiers (block 136). For example the numeric index values in the string of unique identifiers may identify elements in the parameter value list. In some embodiments, the parameter value list is a parameter value array that includes as its elements unique ones of the parameter values. For example, repeated occurrences of the same parameter value may be represented by a single element in the parameter value array. The first and second portions of the compressed URL may be serially combined to generated the compressed URL. Some embodiments provide that the parameter value array may include an identifier, such as, for example, "VA" that precedes the elements in the array. The compressed URL may be stored and/or transmitted (block 138). For example, a variety of processor related technologies may be used to store, transmit and/or receive the compressed URL.

Figure 7:
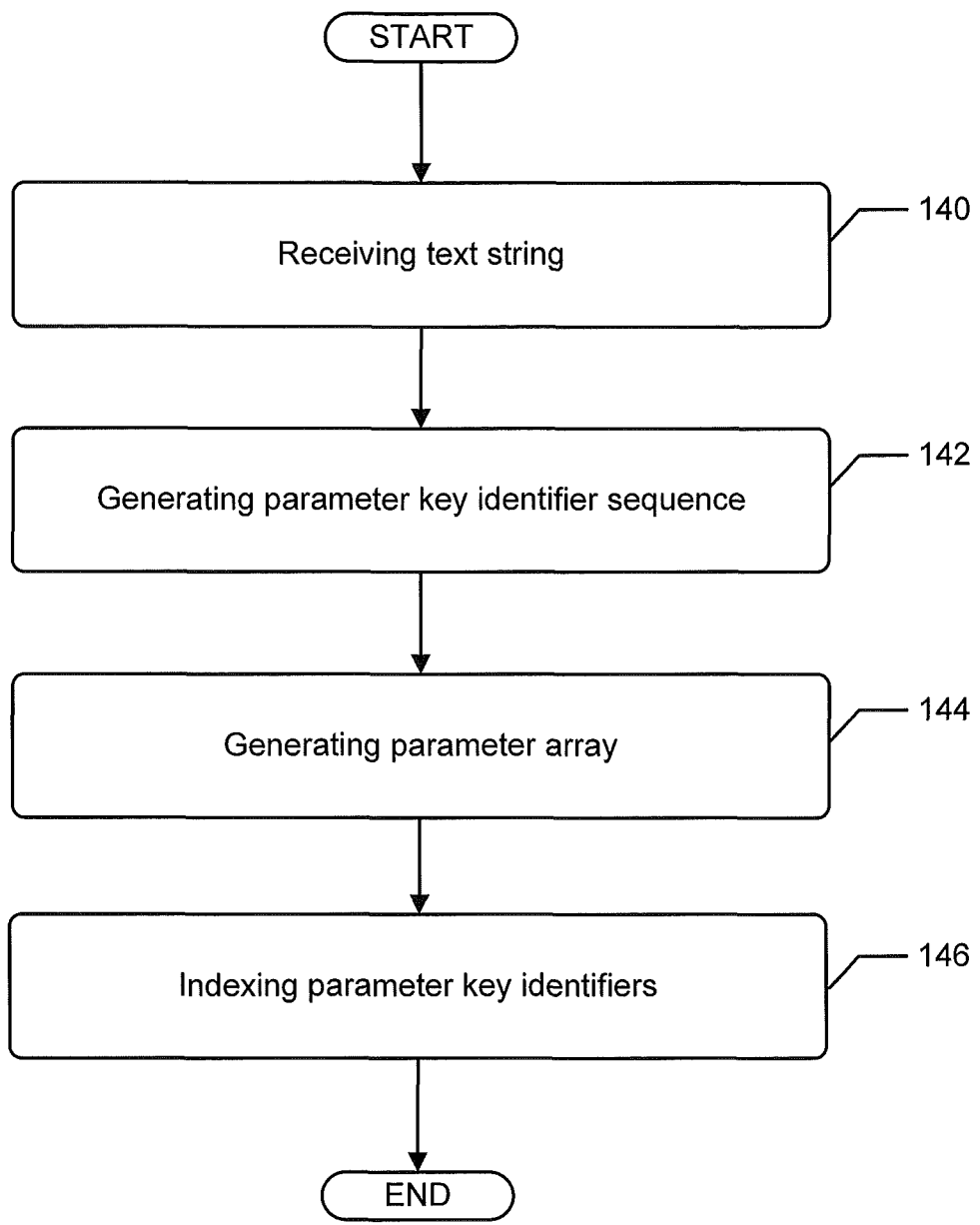
FIG. 7 is a flowchart of operations for compressing a text string according to some embodiments described herein.

Reference is made to FIG. 7, which is a flowchart of operations for compressing a text string according to some embodiments described herein. Operations include receiving a text string that includes multiple combinations of parameter keys and parameter values that are associated with the parameter keys (block 140). A parameter key identifier sequence that corresponds to the parameter keys in the combinations of parameter keys and parameter values is generated (block 142). Some embodiments provide that generating the parameter key identifier sequence includes determining parameter key identifiers that correspond to the parameter keys in the combinations of parameter keys and parameter values. Determining parameter key identifiers may include accessing a persistent data structure such as, for example, a look-up table that includes parameter keys and corresponding parameter key identifiers. In some embodiments, the parameter key identifiers may include truncated alphabetic expressions that may be derived from corresponding parameter key names. For example, the parameter key "MetricName" may correspond to a parameter key identifier "MN". In this manner, the parameter key identifier sequence may be readable without decompression of the compressed text string. Accordingly, since the compressed text string may be readable, the compressed text string may also be edited without performing any decompression operations.

Operations may include generating a parameter value array that corresponds to the parameter values in the combinations of parameter keys and parameter values (block 144). Some embodiments provide the parameter value array includes a single element that represents multiple occurrences of the same parameter value in different ones of the combinations of parameter keys and parameter values. Some embodiments provide that the parameter key identifier sequence includes identifier elements that are separated by delimiting symbols, such as, but not limited to an exclamation point among others. Some embodiments provide that an identifier element includes a key identifier and an index value that corresponds to a parameter value for that parameter key identifier. A subsequent index value that may be separated by a different delimiting symbol may follow the identifier element and identify a second parameter value that corresponds to a different occurrence of that same parameter key identifier. In this manner, repetition of the parameter key identifier may be avoided in the parameter key identifier sequence. Some embodiments provide that a subsequent index value that follows the identifier element and represents a quantity of repeated occurrences of the same parameter key identifier. In such embodiments, a subsequent index value that represents the quantity of repeated occurrences and/or a quantity of total occurrences of the same parameter key identifier may be separated from the identifier element by yet a different delimiting symbol.

In some embodiments, operations may include indexing ones of the parameter key identifiers corresponding to elements in the parameter value array (block 146). Some embodiments provide that a parameter key identifier may be coupled with an index value that identifies which element in a parameter value array corresponds to that parameter key identifier. For example, the parameter key identifier "MN" may be indexed to read MN23 to indicate that the value in position 23 of a corresponding parameter value array corresponds to the parameter key identifier "MN". Additionally, as discussed above regarding FIG. 9A, other index values may follow an earlier instance of the parameter key identifier to indicate other occurrence(s) of the parameter key identifier that correspond(s) to different parameter values. In this regard, some embodiments provide that generating the parameter key identifier sequence may include ordering the parameter key identifiers to group parameter key identifiers that are the same together. By grouping multiple ones of the same parameter key identifiers together, a single identifier combined with index values may represent all of the same identifiers/keys.

Compression may be further realized when multiple ones of the same parameter key (or parameter key identifier) correspond to a same parameter value. In this regard, the parameter key identifier sequence may include an element that includes a first parameter key identifier and an index value range. The index value range may identify the parameter value and which other ones of the parameter key identifiers correspond to that parameter value. Further, additional compression may be realized by using a single element in the parameter value array for the parameter key identifiers that are the same as one another.

Some embodiments provide that compression may be realized when same ones of the parameter key identifiers correspond to different parameter values. The parameter key identifier sequence may include an element that includes a parameter key identifier and an index value that identifies the first parameter value corresponding to that parameter key identifier. A second parameter key identifier sequence element may include a second index value that identifies a second parameter value that corresponds to that parameter key identifier. In this regard, the sequence of parameter key identifiers may be indexed corresponding to elements in the parameter value array.

Figure 8:
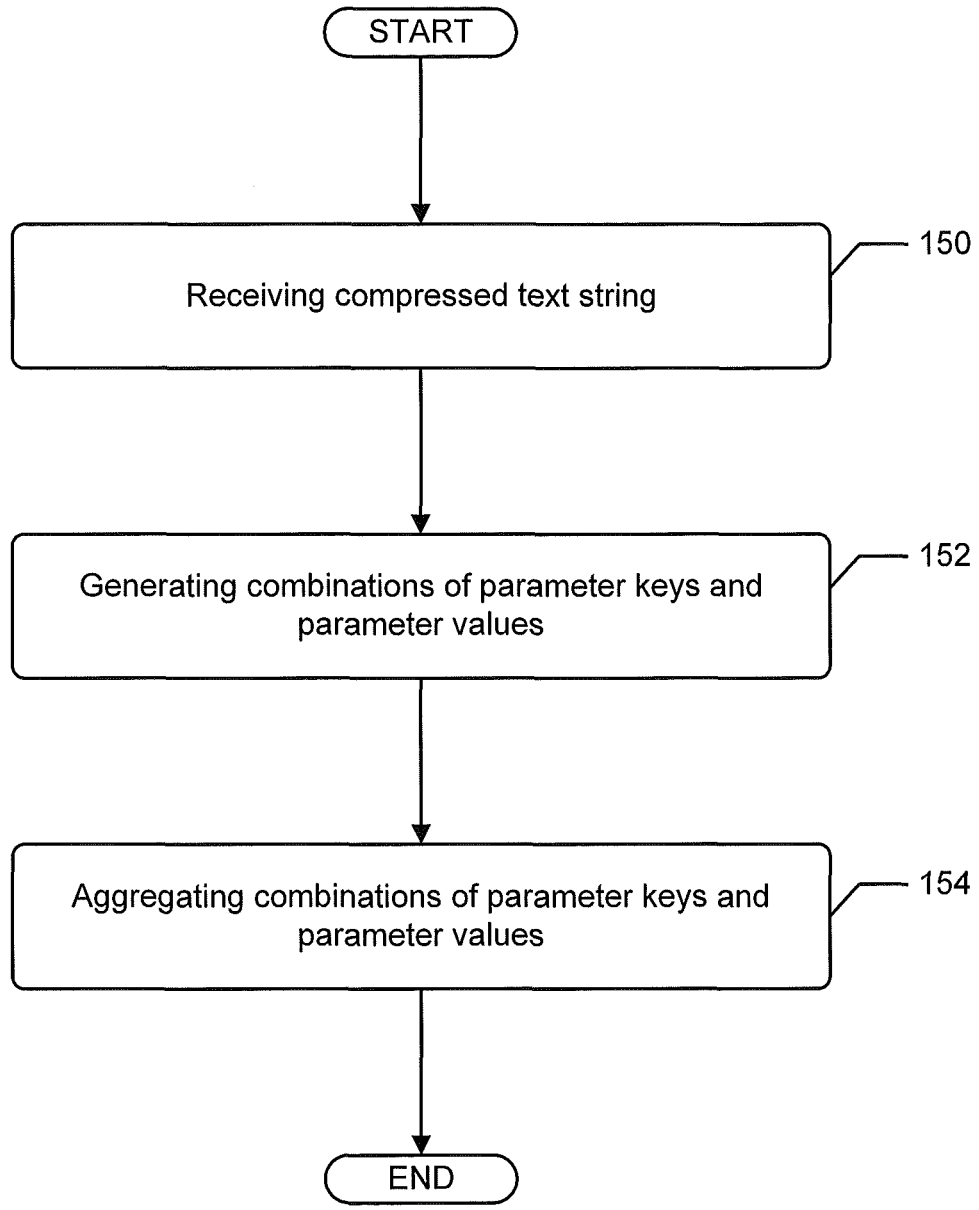
FIG. 8 is a flowchart of operations for decompressing a compressed text string according to some embodiments described herein.

Reference is now made to FIG. 8, which is a flowchart of operations for decompressing a compressed text string according to some embodiments described herein. Operations may include receiving a compressed text string that includes a parameter key identifier sequence and a parameter value array (block 150). The parameter key identifier sequence may include multiple parameter key identifiers that correspond to parameter keys. The parameter value array may include multiple parameter values, each corresponding to one or more of the parameter keys.

Operations according to some embodiments may include generating multiple parameter key/parameter value combinations from the parameter key identifier sequence and the parameter value array (block 152). In some embodiments, generating the parameter key/parameter value combinations may include determining parameter keys from the parameter key identifier sequence. Some embodiments provide that the parameter keys may be determined using a data source such as a look-up table that includes associations between ones of the parameter keys and ones of the parameter key identifiers. For example, a look-up table as described above regarding FIG. 5 that may be used in a compression operation may also be used in the decompression operation.

In some embodiments, determining the parameter keys may include expanding parameter keys using index values in the parameter key identifier sequence. For example, the parameter key identifier sequence may include an element with a single instance of a parameter key identifier that corresponds to multiple different parameter key/parameter value combinations. Some embodiments provide that index values may define a range that indicates how many different one of the parameter key/parameter value combinations are provided. For example, a parameter key identifier sequence element MN6-9 may be expanded to "MetricName=Value6 & MetricName=Value6 & MetricName=Value6 & MetricName=Value6", such that multiple occurrences of the parameter key MetricName correspond to the same value, namely the value in the parameter value array at position number 6. In some embodiments, multiple occurrences of a parameter key and/or parameter key identifier may include an index value that identifies each occurrence of the same key/identifier distinctly. For example, continuing with the above example, a parameter key identifier sequence element MN6-9~6 may be expanded to "MetricName6=Value6 & MetricName7=Value6 & MetricName8=Value6 & MetricName9=Value6". In this example, the "6-9" corresponds to the different occurrences of the MetricName key and the "~6" corresponds to the value in the parameter value array at position number 6. Additionally, if the indexing space may be assumed to be sequential without gaps therebetween and that MetricName 1-5 would have been specified also, then a parameter key identifier sequence element MN~6~9 may indicate that there are nine repetitions for the parameter key MetricName with a value that corresponds to the value in the parameter value array at position number 6.

Some embodiments provide that index values may define multiple different values corresponding to the same parameter key. For example, a parameter key identifier sequence element "MN2~4~5" may be expanded to "MetricName=Value 2 & MetricName=Value4 & MetricName=Value5", such that multiple occurrences of the parameter key MetricName correspond to different values, namely, the values in the parameter value array at positions 2, 4 and 5, respectively. Note that some embodiments include expanding the parameter key identifier sequence before determining the parameter keys. However, some embodiments include determining the parameter keys before expanding the parameter key identifier sequence.

Figure 10:
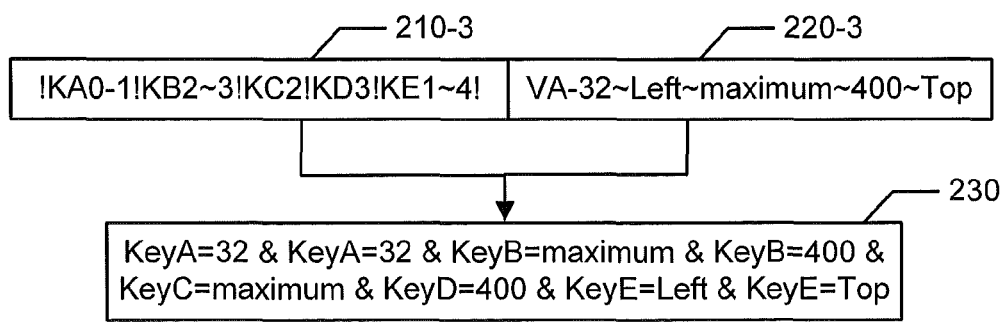
FIG. 10 is a block diagram illustrating an example parameter key identifier sequence, parameter value array and decompressed text string according to some embodiments disclosed herein.

Some embodiments provide that generating the parameter key/parameter value combinations may include associating elements in the parameter value array with corresponding ones of the parameter keys. Brief reference is now made to FIG. 10, which is a block diagram illustrating an example parameter key identifier sequence 210-3, parameter value array 220-3 and decompressed text string 230 according to some embodiments disclosed herein. For example, KA0-1 decompresses into KeyA=32 (value0) and KeyA=32 (value 0). Similarly, KB2~3 decompresses into KeyB=maximum (value 2) and KeyB=400 (value 3). Once the parameter keys are expanded and the parameter values are assigned to the corresponding ones of the parameter keys, the decompressed text string 230 may be generated by aggregating the parameter key/parameter value combinations (block 154).

By virtue of the arranging, grouping and/or ordering of the parameter keys and/or parameter key identifiers, the order of the parameter key/parameter value combinations in a decompressed text string may be different than that of the text string that was compressed.

Various embodiments have been described fully herein with reference to the accompanying figures, in which various embodiments are shown. This disclosure may, however, be embodied in many alternate forms and should not be construed as limited to the embodiments set forth herein.

Accordingly, while the disclosure is susceptible to various modifications and alternative forms, specific embodiments thereof are shown by way of example in the drawings and were described in detail herein. It should be understood, however, that there is no intent to limit the disclosure to the particular forms disclosed, but on the contrary, the disclosure is to cover all modifications, equivalents, and alternatives falling within the spirit and scope of the disclosure as defined by the claims. Like numbers refer to like elements throughout the description of the figures.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises," "comprising," "includes," "including," "have," "having" or variants thereof when used herein, specify the presence of stated features, integers, steps, operations, elements, and/or components, but do not preclude the presence or addition of one or more other features, integers, steps, operations, elements, components, and/or groups thereof. Moreover, when an element/step is referred to as being "responsive" to another element/step (and variants thereof), it can be directly responsive to the other element/step, or intervening elements/steps may be present. In contrast, when an element/step is referred to as being "directly responsive" to another element/step (and variants thereof), there are no intervening elements/steps present.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure. Moreover, although some of the diagrams include arrows on communication paths to show a primary direction of communication, it is to be understood that communication may occur in the opposite direction to the depicted arrows.

Various embodiments are described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s)

These computer program instructions may also be stored in a computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block(s).

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-Ray).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks.

Accordingly, the present disclosure may be embodied in hardware and/or in software (including firmware, resident software, micro-code, etc.) that runs on a processor such as a digital signal processor, which may collectively be referred to as "circuitry," "a module," "an engine," or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

Unless otherwise defined, all terms used herein have the same meaning as commonly understood by one of ordinary skill in the art to which this invention belongs. As used herein, the terms "present" or "provide" may refer to operations for transmitting data from one device to another, or to operations for displaying the data on an electronic device for viewing by a user.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the disclosure and, although specific terms are employed, they are used in a generic and descriptive sense only and not for purposes of limitation, the scope of the disclosure being set forth in the following claims.

That which is claimed:

1. A computer implemented method of compressing a uniform resource locator (URL), the method comprising:
   identifying, via a processor, a plurality of parameter keys in the URL, wherein the URL includes the plurality of parameter keys and a plurality of parameter values and individual ones of the parameter values correspond to individual ones of the parameter keys;
   determining, via the processor, a plurality of parameter key identifiers, wherein individual ones of the parameter key identifiers identify corresponding individual ones of the parameter keys and the individual ones of the parameter key identifiers comprise an abbreviation of the corresponding individual ones of the parameter keys;
   generating, via the processor, a first portion of a compressed URL comprising a string of the parameter key identifiers that includes a single occurrence of the individual ones of the parameter key identifiers; and
   generating, via the processor, a second portion of the compressed URL as a parameter value list that corresponds to the string of the parameter key identifiers and that corresponds to the parameter values.

2. The computer implemented method according to claim 1, wherein determining the plurality of parameter key identifiers comprises accessing a set of ones of the plurality of parameter keys and respective ones of the plurality of parameter key identifiers that correspond to respective ones of the plurality of parameter keys.

3. The computer implemented method according to claim 1, wherein generating the first portion of the compressed URL comprises:
   arranging a sequence of the individual ones of the plurality of parameter key identifiers to group similar ones of the plurality of parameter key identifiers together; and
   numerically indexing the individual ones of the plurality of parameter key identifiers according to an element identification in the parameter value list.

4. The computer implemented method according to claim 1, wherein the parameter value list comprises an array of parameter values.

5. A system, comprising:
   a processor;
   a memory coupled to the processor, the memory including instructions that upon execution cause the processor to compress an uncompressed text string comprising a plurality of parameter key/value sets by instantiating:
      a parameter key identifier sequence generator that is operable to generate a sequence of a plurality of parameter key identifiers from the plurality of parameter key/value sets, the sequence of the plurality of parameter key identifiers including a plurality of sequence numbers that identify unique positions for individual ones of a list of a plurality of parameter values; and
      a parameter value list generator that is operable to generate the list of the plurality of parameter values, wherein individual ones of the plurality of parameter values correspond to individual ones of the plurality of parameter key identifiers;
   wherein a compressed text string includes the sequence of the plurality of parameter key identifiers and the list of the plurality of parameter values;
   wherein a first element in the sequence of the parameter key identifiers corresponds to a first parameter key in the plurality of parameter key/value sets and includes a first sequence number of the plurality of sequence numbers that identifies a corresponding first one of the parameter values and a second element in the sequence of the parameter key identifiers corresponds to a second parameter key in the plurality of parameter key/value sets and includes a second sequence number of the plurality of sequence numbers that identifies a corresponding second one of the parameter values;
   wherein elements in the sequence of the parameter key identifiers include a plurality of elements, respective ones of which are separated by respective ones of a plurality of delimiting symbols; and
   wherein the first element is separated from the second element by one of the plurality of delimiting symbols.

6. The system according to claim 5, wherein the parameter key identifier sequence generator is further operable to identify the individual ones of the plurality of parameter key identifiers using a look-up table that includes associations between the plurality of parameter key identifiers and the plurality of parameter keys in the plurality of parameter key/value sets.

7. The system according to claim 6, wherein the look-up table that includes the associations between the plurality of parameter key identifiers and the plurality of parameter keys in the plurality of parameter key/value sets is stored or transmitted with the compressed text string.

8. The system according to claim 6, wherein the look-up table that includes the associations between the plurality of parameter key identifiers and the plurality of parameter keys in the plurality of parameter key/value sets is stored in at least one remote data storage repository.

9. The system according to claim 5, wherein the parameter key identifier sequence generator is further operable to group the individual ones of the plurality of parameter key identifiers as a function of a similarity of at least one of the plurality of parameter keys.

10. The system according to claim 5,
   wherein the parameter key identifier sequence generator is further operable to identify individual ones of the plurality of parameter keys that are associated with a repeated parameter value, and wherein the parameter value list generator is further operable to generate the list of the plurality of parameter values that includes an element that is the repeated parameter value.

11. The system according to claim 5, wherein the parameter value list generator is further operable to generate the list of the plurality of parameter values that includes a first parameter value that corresponds to the first element in the sequence of the plurality of parameter key identifiers and a second parameter value that corresponds to the second element in the sequence of the plurality of parameter key identifiers, and
wherein the delimiting symbols comprise a first plurality of delimiting symbols and the first parameter value is separated from the second parameter value by one of a plurality of second delimiting symbols that are different from the plurality of first delimiting symbols.

12. The system according to claim 5, wherein the uncompressed text string comprises a uniform resource locator (URL), a uniform resource identifier (URI), or an extensible markup language (XML) expression.

13. A method of compressing a text string, the method comprising:
receiving, via a computing device, the text string that includes a plurality of combinations of a plurality of parameter keys and a plurality of parameter values that correspond to the plurality off parameter keys;
generating, via the computing device, a parameter key identifier sequence that comprises an element that includes a first parameter key identifier and an index value range that identifies which of the plurality of parameter values of a parameter value array correspond to the parameter key identifier from the plurality of combinations of the plurality of parameter keys and the plurality of parameter values; and
generating, via the computing device, the parameter value array from the plurality of combinations of the plurality of parameter keys and the plurality of parameter values, wherein each element in the parameter value array corresponds to a unique one of the plurality of parameter values.

14. The method according to claim 13, wherein generating the parameter key identifier sequence comprises determining a plurality of parameter key identifiers that correspond to the parameter keys in the plurality of the combinations of the plurality of parameter keys and the plurality of parameter values.

15. The method according to claim 13, further comprising indexing the individual ones of a plurality of parameter key identifiers corresponding to elements in the parameter value array.

16. The method according to claim 13,
wherein the parameter key identifier sequence includes a first element that includes a first parameter key identifier and a first index value that identifies a first value in the parameter value array that corresponds to the first parameter key identifier, and
wherein the parameter key identifier sequence includes a second element that includes a second parameter key identifier and a second index value that identifies a second value in the parameter value array.

17. The method according to claim 15, wherein indexing the individual ones of the plurality of parameter key identifiers corresponding to elements in the parameter value array comprises indexing individual ones of the plurality of parameter key identifiers according to a location of a corresponding element in the parameter value array.

18. The method according to claim 13, wherein the parameter key identifier sequence includes a plurality of identifier elements, individual ones of which are separated by respective ones of a plurality of first delimiting symbols; and
wherein an identifier element includes the first parameter key identifier and a first integer index value that corresponds to a first parameter value for the first parameter key identifier or a second integer index value that corresponds to a second parameter value that corresponds to a different occurrence of the first parameter key identifier.

19. The method according to claim 13, wherein the text string includes a uniform resource locator (URL), a uniform resource identifier (URI), or an extensible markup language (XML) expression.

20. A computer program product comprising a non-transitory computer-readable medium having executable computer-readable program code therein configured to implement the method of claim 13 for compressing the text string.

21. A method of decompressing a compressed text string, the method comprising:
receiving, via a computing device, the compressed text string that includes a parameter key identifier sequence and a parameter value array, wherein the parameter key identifier sequence includes a plurality of parameter key identifiers and the parameter value array includes a plurality of parameter values that correspond to individual ones of a plurality of parameter keys; and
generating, via the computing device, a plurality of combinations of the plurality of the parameter keys and the plurality of parameter values from the parameter key identifier sequence and the parameter value array, wherein individual ones of the plurality of combinations comprise a first subset of the parameter keys that corresponds to the parameter key identifier sequence and a second subset of the parameter values that corresponds to the parameter value array,
wherein a decompressed text string includes the plurality of combinations of the plurality of parameter keys and the plurality of parameter values.

22. The method according to claim 21, wherein generating the plurality of combinations of parameter keys and parameter values from the parameter key identifier sequence and the parameter value array comprises:
determining, via the computing device, the plurality of parameter keys from the parameter key identifier sequence; and
associating, via the computing device, individual ones of a plurality of elements in the parameter value array with corresponding individual ones of the plurality of parameter keys.

23. The method according to claim 22, wherein determining, via the computing device, the plurality of parameter keys includes using a look-up table that includes a plurality of associations between the individual ones of the plurality of parameter keys and the individual ones of the plurality of parameter key identifiers.

24. The method according to claim 22,
wherein determining, via the computing device, the plurality of parameter keys comprises expanding the individual ones of the parameter keys based on corresponding ones of parameter key identifiers in the parameter key identifier sequence;
wherein associating, via the computing device, individual ones of the plurality of elements in the parameter value array comprises associating individual ones of the plurality of elements with expanded parameter keys using a plurality of index values to identify the elements in the parameter value array to generate a plurality of parameter key/value combinations; and the method further comprising generating, via the computing device, the decompressed text string by aggregating the plurality of parameter key/value combinations.

25. The method according to claim 21,
wherein the decompressed text string comprises an extensible mark-up language (XML) string, a uniform resource locator (URL), or a uniform resource indicator (URI).

26. The method according to claim 21, wherein a first order of the individual ones of the plurality of combinations of parameter keys and parameter values in the decompressed text string is different than a second order of the individual ones of the plurality of combinations of parameter keys and parameter values in an uncompressed text string that was compressed into the compressed text string.

27. A computer program product for generating a compressed uniform resource locator (URL), the computer program product comprising a non-transitory computer-readable medium having computer-readable program code executable by a computer, the computer-readable program code comprising:

code that is configured to generate a string of a plurality of parameter key identifiers via a look-up table that includes associations between individual ones of a plurality of parameter keys and individual ones of the plurality of parameter key identifiers, wherein the individual ones of the parameter key identifiers correspond to the individual ones of a plurality of parameter keys in an uncompressed URL;

code that is configured to generate a parameter value array that includes a plurality of unique parameter values from the uncompressed URL as elements of the parameter value array; and code that is configured to index the string of the parameter key identifiers to correspond to elements in the parameter value array.

28. The computer program product according to claim 27,
wherein the parameter key identifiers in the string of parameter key identifiers are represented using a plurality of index values.

29. The computer program product according to claim 27, wherein a first element in the parameter value array corresponds to a first member of the string of parameter key identifiers and a second element in the parameter value array corresponds to a second member of the string of parameter key identifiers.

30. The computer program product according to claim 27, wherein the individual ones of the parameter key identifiers comprise a truncated alphabetic expression of a corresponding parameter key.

31. The computer program product according to claim 27, wherein the string of parameter key identifiers includes at least one parameter key identifier with a corresponding index value range, wherein the corresponding index value range identifies additional ones of the parameter key identifiers that have a same parameter value as the at least one parameter key identifier.

* * * * *